United States Patent
Cox et al.

(10) Patent No.: US 7,263,672 B2
(45) Date of Patent: Aug. 28, 2007

(54) METHODS, SYSTEMS, AND DATA MODELS FOR DESCRIBING AN ELECTRICAL DEVICE

(75) Inventors: David Cox, Raleigh, NC (US); Thomas J. Lanoue, Cary, NC (US)

(73) Assignee: ABB Research Ltd., Zurich (CH)

( * ) Notice: Subject to any disclaimer, the term of this patent is extended or adjusted under 35 U.S.C. 154(b) by 348 days.

(21) Appl. No.: 10/933,535

(22) Filed: Sep. 3, 2004

(65) Prior Publication Data

US 2006/0053398 A1  Mar. 9, 2006

(51) Int. Cl.
*G06F 17/50* (2006.01)
*G06F 9/44* (2006.01)
*G06F 9/445* (2006.01)

(52) U.S. Cl. .................. 716/1; 716/3; 716/4; 716/5; 717/104; 717/174

(58) Field of Classification Search .............. 716/1, 716/3–5, 17–19; 717/104; 700/97; 348/807; 333/185; 73/17
See application file for complete search history.

(56) References Cited

U.S. PATENT DOCUMENTS

| | | | |
|---|---|---|---|
| 4,986,124 A * | 1/1991 | Byrne et al. ................... 73/317 |
| 6,211,766 B1 | 4/2001 | Goseberg et al. | |
| 6,239,557 B1 | 5/2001 | Chang et al. | |
| 6,473,139 B1 * | 10/2002 | George ....................... 348/807 |
| 6,516,451 B1 * | 2/2003 | Patin ............................. 716/4 |
| 6,606,731 B1 * | 8/2003 | Baum et al. .................... 716/3 |
| 6,961,918 B2 * | 11/2005 | Garner et al. ................. 716/18 |
| 2004/0060014 A1 * | 3/2004 | Khalil ........................... 716/1 |
| 2004/0172603 A1 * | 9/2004 | Collmeyer et al. ............ 716/1 |
| 2004/0207487 A1 * | 10/2004 | Hayashi ...................... 333/185 |
| 2005/0080502 A1 * | 4/2005 | Chernyak et al. ............. 700/97 |
| 2005/0193361 A1 * | 9/2005 | Vitanov et al. ............... 716/19 |
| 2005/0278670 A1 * | 12/2005 | Brooks et al. ................. 716/5 |
| 2005/0289484 A1 * | 12/2005 | Whitefoot et al. ............. 716/1 |
| 2006/0064667 A1 * | 3/2006 | Freitas ........................ 717/104 |
| 2006/0085781 A1 * | 4/2006 | Rapp et al. .................. 716/17 |
| 2006/0178864 A1 * | 8/2006 | Khanijo et al. ............... 703/20 |

FOREIGN PATENT DOCUMENTS

EP  0 991 092 A1  4/2000

OTHER PUBLICATIONS

"The Impact Of Inrush Currents On The Mechanical Stress Of High Voltage Power Transformer Coils" by Michael Steurer, IEEE Transaction on Power Delivery, vol. 17, No. 1, Jan. 2002, pp. 155-160.

* cited by examiner

*Primary Examiner*—Paul Dinh
*Assistant Examiner*—Helen Rossoshek
(74) *Attorney, Agent, or Firm*—Paul R. Katterle

(57) ABSTRACT

A method and system are described for creating a metadata text file corresponding to a geometry of a physical layout and/or a circuit layout of an electrical device. The layouts are defined in a user interface. A text file having metadata elements in a hierarchical format is produced that can be used by other programs.

21 Claims, 6 Drawing Sheets

METHODS, SYSTEMS, AND DATA MODELS FOR DESCRIBING AN ELECTRICAL DEVICE

BACKGROUND

Electrical devices can include many components arranged in a variety of physical arrangements. Describing the physical arrangements, i.e., physical layout or circuit layout, to a computer can often be time consuming. An electrical device can be defined using a complex computer programming language that involves many hours to produce.

SUMMARY

A method is disclosed for creating a metadata text file corresponding to a physical configuration of an electrical device. According to an exemplary method, a physical configuration of an electrical device is defined. A text file having metadata elements corresponding to the physical configuration in a hierarchical format is then produced.

In an exemplary embodiment, the physical configuration is a geometry of a physical layout of the electrical device, the geometry representing the electrical device as blocks. In another embodiment, a method for creating a metadata text file corresponding to a physical configuration of a circuit layout of an electrical device is disclosed. The method includes defining a circuit layout of an electrical device, the circuit layout representing the electrical device as windings, segments, and nodes and producing a text file having metadata elements corresponding to the windings, segments, and nodes in a hierarchical format.

In an exemplary embodiment, a data model is disclosed for defining a geometry of a physical layout of an electrical device as blocks and sub-blocks using a metamarkup language. The data model includes a metadata element for each block and each sub-block associated with the block. The metadata elements can be arranged in a hierarchical format.

A data model is disclosed for defining a circuit layout of an electrical device as windings, segments, and nodes using a metamarkup language. The data model includes a metadata element for each winding, and a metadata element for each segment associated with a respective winding. A node metadata element is included for each node located at one of an end of a winding or a junction of multiple windings. The metadata elements can be arranged in a hierarchical format.

In another embodiment, a system for creating a metadata text file corresponding to a physical configuration, such as a geometry of a physical layout, of an electrical device is disclosed. The system includes input means for defining a physical configuration as a geometry of a physical layout of an electrical device, the geometry representing the electrical device as blocks and sub-blocks, processor means for processing the physical layout and producing a text file having metadata elements corresponding to the blocks and sub-blocks in a hierarchical format, and memory means for storing the text file.

In another embodiment, a system for creating a metadata text file corresponding to a circuit layout of an electrical device is disclosed. The system includes input means for defining a physical configuration as a circuit layout of an electrical device, the circuit layout representing the electrical device as windings, segments, and nodes. Processor means for processing the circuit layout and producing a text file having metadata elements corresponding to the windings, segments, and nodes in a hierarchical format; and memory means for storing the text file.

BRIEF DESCRIPTION OF THE DRAWINGS

The present invention will become apparent to those skilled in the art upon reading this description in conjunction with the accompanying drawings, in which like reference numerals have been used to designate like elements, and in which.

DETAILED DESCRIPTION

Exemplary embodiments of the present invention are directed to accurately defining and producing an electrical device in a manner which eliminates manual encoding by a programmer using a complex programming language. Methods, systems, and data models are employed to define a physical configuration (i.e., physical characteristics, such as the geometry of a physical layout and/or a circuit layout) of an electrical device. Metadata and a recursive data structure are used to produce a text file according to a metamarkup language, such as Extensible Markup Language ("XML"). Other metamarkup languages can be used to produce a text file.

Electrical devices can include, but are not limited to, capacitors, resistors, coils, switchgear, transformers, and the like. A transformer will be used for purposes of this description, but one of ordinary skill in the art will recognize that the techniques described herein can be extended to many other electrical devices.

Figure 1:
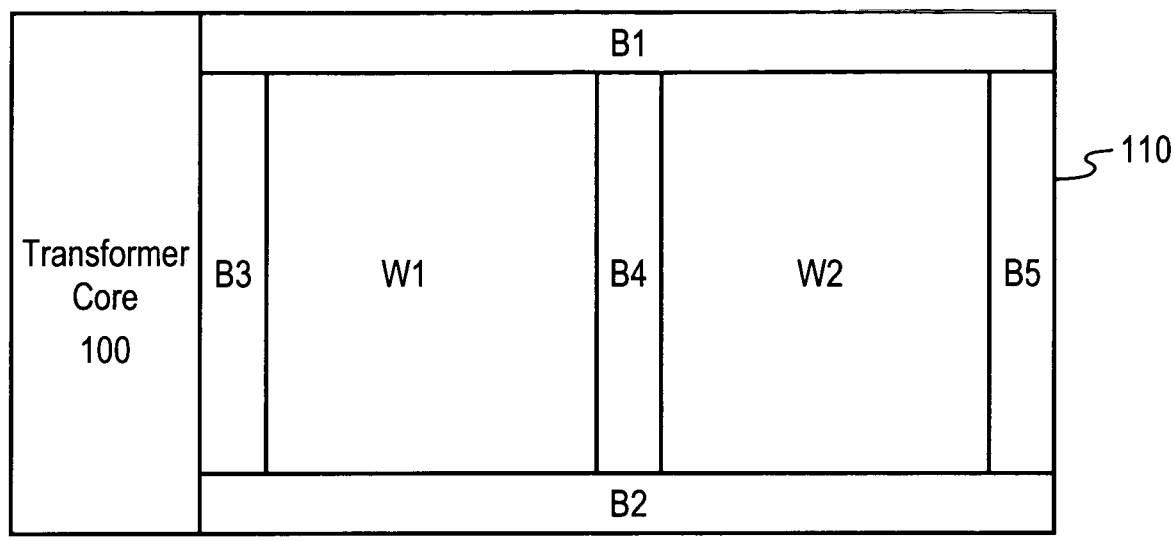
FIG. 1 illustrates an exemplary geometrical layout of a cross section of a transformer.

A geometrical layout of a cross section of a transformer is shown in FIG. 1. A transformer includes a core 100, which is shown only for orientation purposes. The transformer includes barriers B1-B5 and windings W1-W2. The barriers B1-B5 insulate windings W1-W2 from each other and therefore include insulating materials, such as resin, electrical glass, paper, and the like.

The physical layout of the barriers and windings can be described using a hierarchical data model. The data model includes an abstract component called a block to arrange barriers and windings either horizontally or vertically. A block can be either a horizontal block or a vertical block. A block can also include sub-blocks. For example, in FIG. 1, block 110 includes barrier B3, winding W1, barrier B4, winding W2, and barrier B5. The sub-blocks in a horizontal block are arranged horizontally. The sub-blocks in a vertical block are arranged vertically. A block can contain barriers, windings, and sub-blocks.

The physical layout in FIG. 1 can be defined using the following general hierarchical data model:

```
vertical block
    barrier B1
    horizontal block 110
        barrier B3
        winding W1
        barrier B4
        winding W2
        barrier B5
    barrier B2
```

The vertical block defines the entire physical layout. The horizontal block 110 defines the middle section of the physical layout between the top and bottom barriers. Because blocks can contain sub-blocks any physical layout can be described using a hierarchical data model. Any metadata created to describe this physical layout must reflect this data model and its hierarchical nature.

A data model for defining a geometry of a physical layout of the electrical device of FIG. 1 as blocks and sub-blocks using a metamarkup language is shown below:

```
<physicalLayout layout="vertical">
    <barrier name="B1" />
    <block layout="horizontal">
        <barrier name="B3" />
        <winding="W1" />
        <barrier name="B4"/>
        <winding="W2"/>
        <barrier name="B5" />
    </block>
    <barrier name="B2" />
</physicalLayout>
```

The data model includes a metadata element for each block, and a metadata element, referred to herein as a child metadata element, for each sub-block associated with a respective block. The metadata elements are arranged in a hierarchical format. For example, indented under the metadata element <block layout="horizontal"> are the child metadata elements for barrier B3, winding W1, barrier B4, winding W2, and barrier B5, in that order, as shown in FIG. 1. Each child metadata element is positioned in the data model between a start tag and an end tag of the metadata element. The metadata elements and child metadata elements can include an attribute, such as the term "name="B3"" in <barrier name="B3">.

Figure 2:
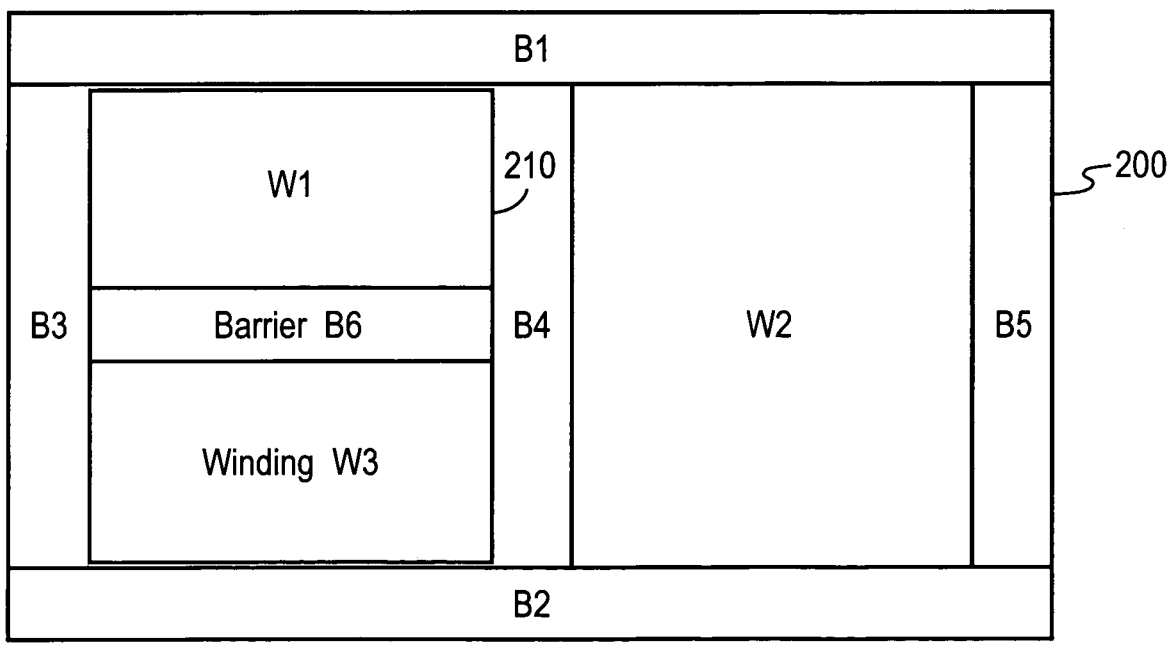
FIG. 2 illustrates another example of a geometrical layout of a cross section of a transformer.

FIG. 2 illustrates another example of a geometrical layout of a cross section of a transformer. In this example, a vertical block defines the entire physical layout, a horizontal block 200 defines the middle section of the physical layout between the top and bottom barriers B1, B2, and a vertical block defines the left section of the middle section between barriers B3 and B4. The physical layout in FIG. 2 can be defined using the following general hierarchical data model:

```
vertical block
    barrier B1
    horizontal block 200
```

```
        barrier B3
        vertical block 210
            winding W1
            barrier B6
            winding W3
            barrier B4
        winding W2
        barrier B5
    barrier B2
```

Figure 3:
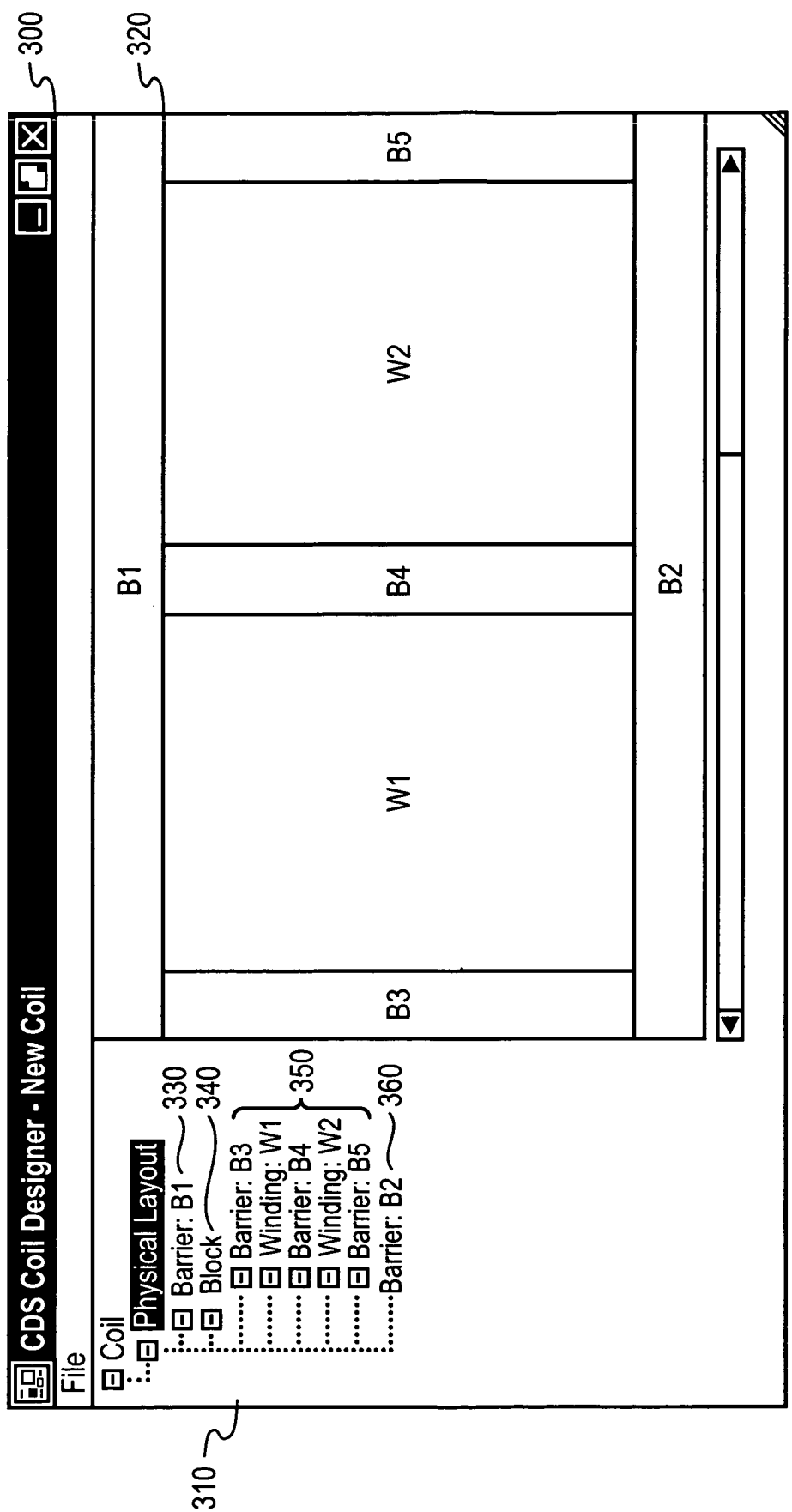
FIG. 3 illustrates an exemplary graphical user interface for creating a metadata text file corresponding to a geometry of a physical layout of an electrical device.

FIG. 3 is a computer graphics window 300 illustrating a graphical user interface for creating a metadata text file corresponding to a geometry of a physical layout of an electrical device. In the left pane 310 of the window is a tree view that shows a hierarchy of block identifiers. The right pane 320 shows a graphical representation of the physical layout.

Initially, the left pane 310 contains only a single block, called "Physical Layout" in FIG. 3, and the right pane 320 contains no barriers, windings, or blocks. A user adds block identifiers in the left pane 310 and the blocks are displayed in the right pane 320. The block identifiers are positioned sequentially according to the geometry of the physical layout. When the block contains a sub-block, a sub-block identifier representing the sub-block is added. For example, B3, W1, B4, W2, and B5 350 are sub-blocks within block 340. The sub-block identifier is positioned sequentially according to the geometry of the physical layout within the block, in this case, left-to-right. Each block or sub-block can have characteristics (e.g., shape (which, in an exemplary embodiment, can be assumed to be a particular shape, such as rectangle), position, orientation and size) stored in a file that is accessed by a drop down menu when a block or sub-block is selected by a user. The corresponding file is accessed from a memory of the computer to render an image of the block or sub-block in the pane 320. Alternately, an entire transformer configuration can be considered as an outermost block having a given shape and a given size. This information can be stored in the file, as an outermost block. Starting at an upper left hand corner of this outermost block, a drill down process can be used to fill in the various components of the outermost block. For example, this operation can begin by calculating the sizes of barriers based, for example, on an assumption that they correspond to a certain percentage of the displayable screen width. A further drill down can be used to determine space remaining after allocation of the barriers for allocation among all leftover components of the transformer. The operation can proceed recursively, repeatedly dividing the space until all blocks and sub-blocks within the transformer have been allocated. For each block, a recursive function can be used to draw the blocks, each of which can contain any number (i.e., 0 or more) of child nodes.

Many methods can be used to add the block identifiers into the left pane of the graphical user interface. For example, a user can right click "Physical Layout" using a computer mouse and a popup menu appears allowing the user to add a barrier, winding or a block. Alternatively, the user can type the block identifiers in using a keyboard. As block identifiers are added in the left pane 310, the blocks are generated and displayed in the right pane 320. For example, the user adds block identifiers for B1 330, B2 360, and the block 340 to the Physical Layout. Then the user would right click the block 340 and add block identifiers for B3, W1, B4, W2, and B5 350.

Once the physical layout is defined, a text file is generated by a computer processor and stored in a computer memory. The user can launch a command with the user interface, e.g., selects a file menu command, to initiate the generation of the text file, or it can be done automatically by the computer processor.

Exemplary functionality which can be performed by the computer processor to draw a physical layout of a transformer coil is embodied in the following pseudocode:
Transformer coils can be described using a tree data structure. The object at the top of the tree is called a Block. The algorithm starts with this object.
The tree is organized specifically as a binary tree. Therefore, the algorithm can implement a type of binary tree traversal. As the algorithm traverses the tree it draws each item that it encounters. However, only Barriers and Windings are drawn. Blocks are never drawn. Blocks are internal nodes that hold other nodes (i.e. Barriers, Windings, and other Blocks). When a Block is encountered during the traversal, the function, DrawPhysicalLayout, is called recursively.
Call DrawPhysicalLayout passing it the root of the tree, the x and y location for the drawing and the width and height of the drawing

```
function DrawPhysicalLayout(Block b, int x, int y, int width, int height)
    Count the number of child nodes
    Count the number of child nodes that are barriers
    Calculate the space occupied by all the barriers
    this equal number of barriers times the space of each barrier
    Calculate the space occupied by all the other child nodes
    this equals the total space minus the space occupied by the barriers
    Calculate the space of a single non-barrier child node
    this equals the non-barrier space/(total number of child nodes - number
        of barriers)
    Draw each child node starting at X and Y and working left to right
        if a node is a Barrier draw it in the space allocated
        else if a node is a Winding draw it in the space allocated
        else if a node is a Block call DrawPhysicalLayout passing the X
            and Y
            location of the Block and the width and height of the Block
    end Draw
end function
```

Figure 7:
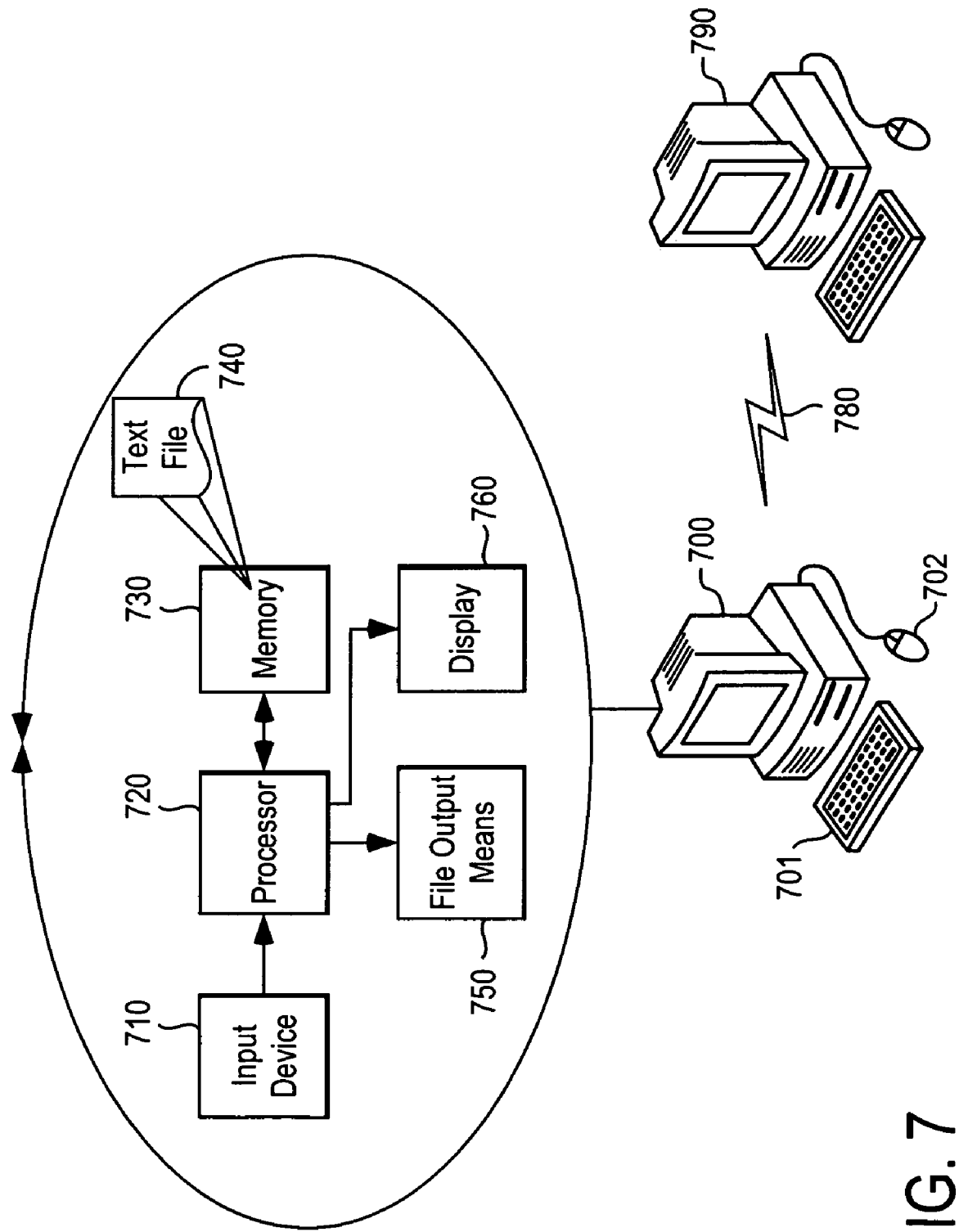
FIG. 7 illustrates an exemplary system for creating a metadata text file corresponding to a geometry of a physical layout and/or circuit layout of an electrical device.

A system for creating a metadata text file corresponding to a physical configuration, such as a geometry of a physical layout, of an electrical device is shown in FIG. 7. A computer 700 includes input means, such as a keyboard 701 and/or mouse 702, for defining a physical configuration of an electrical device. Processor means 720 are included for processing the physical configuration and for producing a text file having metadata elements, corresponding to the physical configuration, in a hierarchical format. Although a desktop computer 700 is shown for illustrative purposes, it should be understood that any device having a processor can be used, such as a laptop computer, a PDA, mobile station, and the like.

The input means 710 can be used to define a geometry of a physical layout of an electrical device as blocks and sub-blocks. The system also includes processor means 720 for processing the physical layout and producing a text file having metadata elements corresponding to the blocks in a hierarchical format, and memory means 730 for storing the text file 740. Display means 760 display a graphical representation of the physical layout of the electrical device. File output means 750 forward the text file to an application for processing. The file output means 750 can output the text file 740 to an application within the same computer 700 or to an application in another computer 790 via a communication network 780, wired or wireless, such as a LAN, the Internet, a WiFi connection, infrared, and the like.

Figure 8:
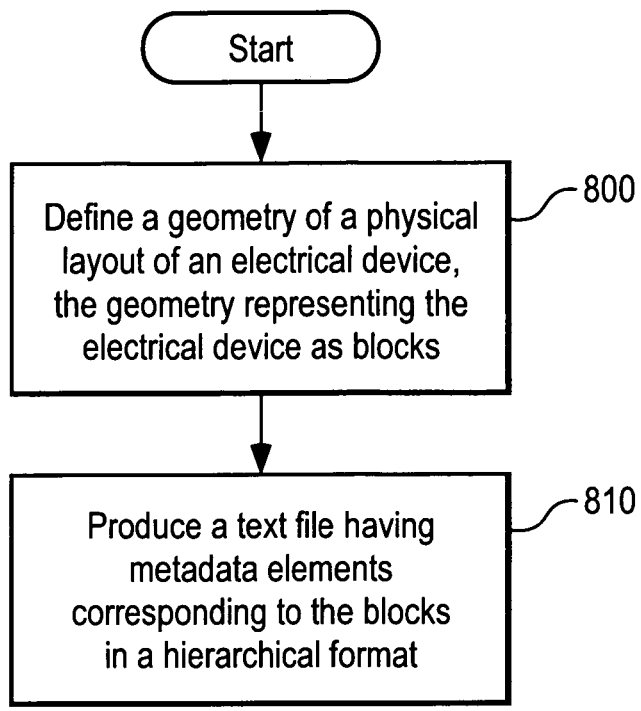
FIG. 8 is an exemplary flow chart illustrating a method for creating a metadata text file corresponding to a geometry and/or circuit layout of a physical layout and/or circuit layout of an electrical device.

FIG. 8 is a flow chart illustrating a method which corresponds to the foregoing pseudocode for creating a metadata text file corresponding to a geometry of a physical layout of an electrical device. A geometry of a physical layout of an electrical device is defined (800). The geometry represents the electrical device as blocks, as discussed above. A text file having metadata elements corresponding to the blocks in a hierarchical format is produced (810).

Figure 4:
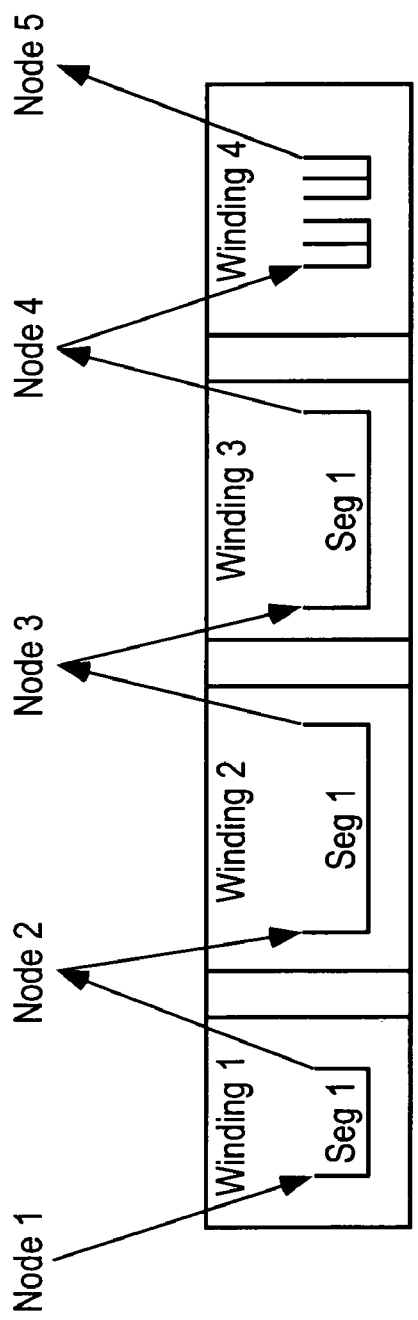
FIG. 4 illustrates an exemplary circuit layout for a transformer having four windings connected in series.

The foregoing describes use of a hierarchical data model to describe a geometry of a physical layout of an electrical device. According to another embodiment, a hierarchical data model can be used to describe a circuit layout of an electrical device. For example, FIG. 4 illustrates a circuit layout for a transformer having four windings 1-4 that are connected in series. The windings may include one or more segments connected together. In FIG. 4, windings 1-3 have one segment and winding 4 has five segments (i.e., wherein the middle segment is a break segment). Between each winding is a node. Current leaves a winding, flows to a node, and then flows into the next winding, as depicted by the arrows.

Figure 5:
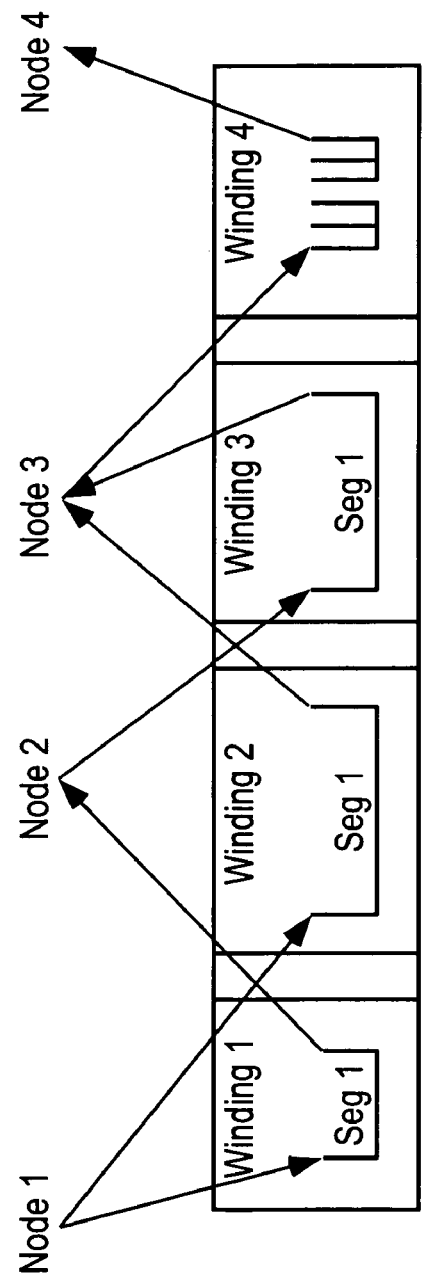
FIG. 5 illustrates an exemplary circuit layout for a transformer having four windings connected in parallel.

FIG. 5 illustrates a circuit layout for a transformer having the same four windings 1-4, but connected in parallel. As in FIG. 4, windings 1-3 have one segment and winding 4 has five segments. Current flow, however, is more complex. Current flows from Node 1 to windings 1 and 2. Current flows into Node 3 from windings 2 and 3. FIG. 5 illustrates how nodes can have multiple sources and destinations for current flow. Winding 4 consists of five segments. Unless current flow is redirected to a node, current will flow from one segment to the adjacent segment. The middle segment of winding 4 is a break segment. Current does not flow through a break segment per se. Instead, a break segment provides configurable electrical connections within winding 4 that connect segments before the break segment to those after the break segment.

A hierarchical data model is used to describe a circuit layout. At the top of the hierarchy is the entire circuit layout. At the next level of the hierarchy are windings and circuits. Below windings are the segments and below segments are the start and finish leads. Below circuits are the nodes. Below each node are the nodes' sources and destinations.

A data model for defining a circuit layout of an electrical device as windings, segments, and nodes using a metamarkup language includes a metadata element for each winding and a metadata element, referred to herein as a child metadata element, for each segment associated with a respective winding. The child metadata element is a child of a parent metadata element that corresponds to the respective winding. A node metadata element for each node is located at one of an end of a winding or a junction of multiple windings. The metadata elements and child metadata elements are arranged in a hierarchical format. Each child metadata element is positioned in the data model between a start tag and an end tag of the parent metadata element. The electrical device can be a transformer, for example, and a winding represents a winding of the transformer, one or more segments represent a winding configuration, and a node represents an end of a winding or a junction of multiple windings, as described above.

A data model for defining a circuit layout of FIG. 4 is shown below.

```
<CircuitLayout name="PC1">
    <Winding name="W1">
        <Segment name="S1">
            <StartLead name="s"/>
            <FinishLead name="f"/>
        <Segment>
    </Winding>
    <Winding name "W2">
        <Segment name="S1">
            <StartLead name="s"/>
            <FinishLead name="f"/>
        <Segment>
    </Winding>
    <Winding name "W3">
        <Segment name="S1">
            <StartLead name="s"/>
            <FinishLead name="f"/>
        <Segment>
    </Winding>
    <Winding name "W4">
        <Segment name="S1">
            <StartLead name="s"/>
            <FinishLead name="f"/>
        <Segment>
        <Segment name="S2">
            <StartLead name="s"/>
            <FinishLead name="f"/>
        <Segment>
        <Segment name="S3">
            <StartLead name="s"/>
            <FinishLead name="f"/>
        <Segment>
        <Segment name="S4">
            <StartLead name="s"/>
            <FinishLead name="f"/>
        <Segment>
        <Segment name="S5">
            <StartLead name="s"/>
            <FinishLead name="f"/>
        <Segment>
    </Winding>
    <Circuit name="C1">
        <Node name="N1">
            <Dst Winding="W1" Segment="S1" Lead="s" />
        </Node>
        <Node name="N2" >
            <Src Winding="W1" Segment="S1" Lead="f" />
            <Dst Winding="W2" Segment="S1" Lead="s" />
        </Node>
        <Node name="N3" >
            <Src Winding="W2" Segment="S1" Lead="f" />
            <Dst Winding="W3" Segment="S1" Lead="s" />
        </Node>
        <Node name="N4" >
            <Src Winding="W3" Segment="S1" Lead="f" />
            <Dst Winding="W4" Segment="S1" Lead="s" />
        </Node>
        <Node name="N5">
            <Src Winding="W4" Segment="S5" Lead ="f" />
        </Node>
    </Circuit>
</CircuitLayout>
```

Figure 6:
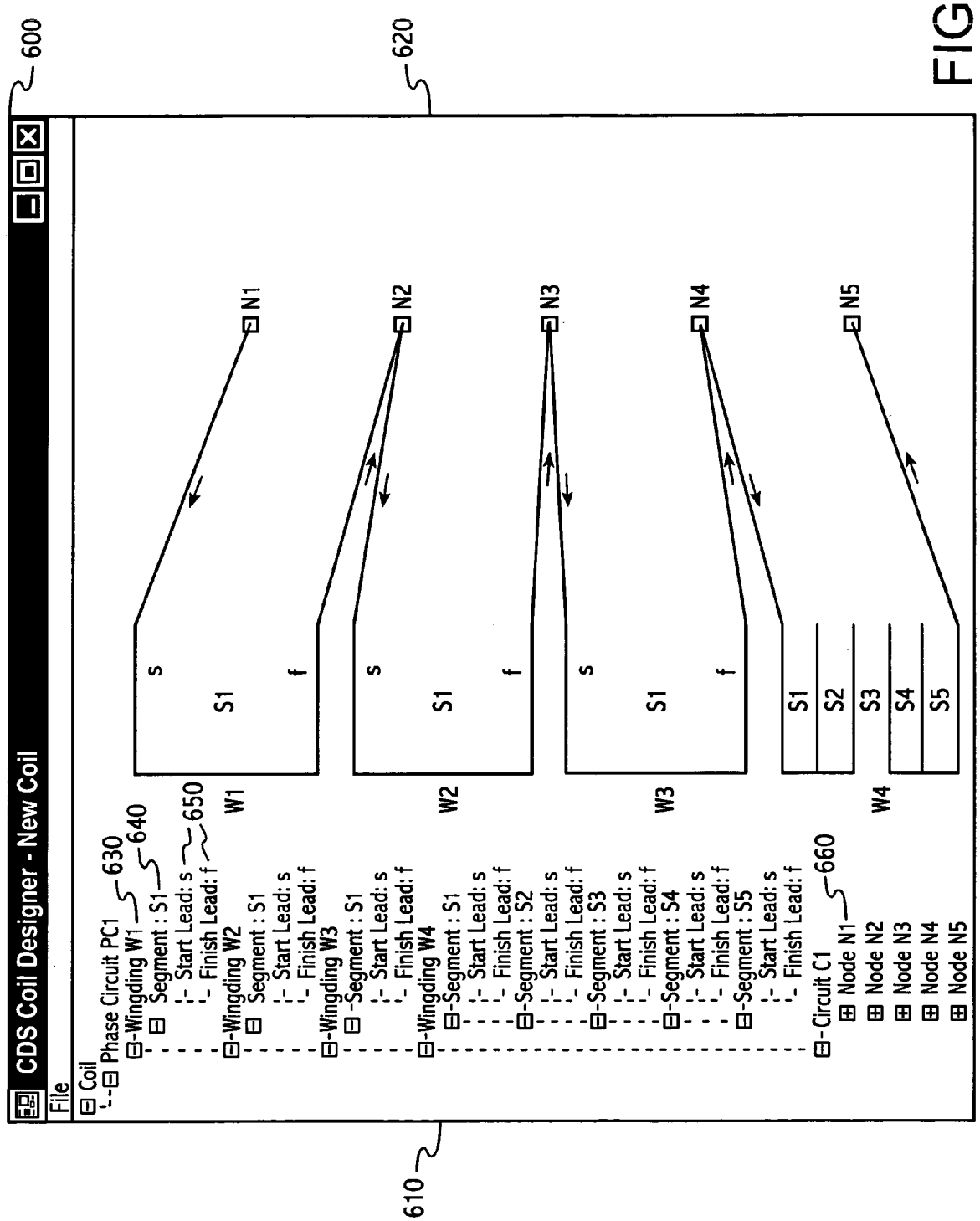
FIG. 6 illustrates an exemplary graphical user interface for creating a metadata text file corresponding to a circuit layout of an electrical device.

FIG. 6 is a computer graphics window illustrating a graphical user interface for creating a metadata text file corresponding to a circuit layout of an electrical device. In the left pane 610 of the window is a tree view that shows a hierarchy of block identifiers. The right pane 620 shows a graphical representation of the circuit layout. Initially, the left pane 610 contains only a single identifier, "Coil", in the example of FIG. 6, and the right pane 620 is empty. A user adds identifiers in the left pane 610 and the corresponding graphics are displayed in the right pane 620. For example, winding identifiers 630, segment identifiers 640, start/finish lead identifiers 650 and node identifiers 660 are added in left pane 610. The identifiers are positioned sequentially according to the circuit layout. For example, windings W1-W3 are shown, each with a segment S1, and winding W4 with segments S1-S5. Nodes N1-N5 are also shown.

The system of FIG. 7 can be used for creating a metadata text file corresponding to a circuit layout of an electrical device. Display means 760 display a graphical representation of the circuit layout of the electrical device corresponding to the winding identifier, segment identifiers, and node identifier.

Many methods can be used to add circuit layout components into the left pane. For example, a user right clicks "Coil" using the mouse 702 and a popup menu appears allowing the user to add a winding or circuit. Segments and nodes, respectively, can be added to the winding and circuit the same way. Alternatively, the user can type in the components using a keyboard 701. As circuit layout components are added in the left pane 610, the blocks are generated and displayed in the right pane 620. In this example, windings 1, 2, and 3 have one segment each. However, five segments were added to winding 4. Segment 3 in winding 4 is a break segment and can be designated as such on the right side by a different color. Sources and destinations can be added to each node 660.

Once the phase circuit is defined, the text file 740 is generated by the processor 720 and stored in the memory 730. The user can launch a command with the user interface, e.g., selects a file menu command, to initiate the generation of the text file 740, or it can be done automatically by the processor 720 for drawing a phase circuit diagram.

Exemplary functionality which can be performed by the processor 720 is embodied in the following pseudocode:

```
foreach winding contained in the phase circuit
    calculate the X and Y location for where the winding will be placed on
        the screen
    calculate the height and width of the winding
    calculate the height and width of each segment in the winding
    Save these values for later use
    draw rectangle for the winding
    foreach segment in the winding
        draw lines to represent each segment
        determine the type of segment
        fill in the segment's area with a color appropriate for its type
    end foreach
end foreach
foreach node in the circuit
    calculate the X and Y location for where the node will be placed on the
        screen
    calculate the height and width of the node
    draw rectangle for the node
    foreach source in the node
        determine the source's winding, segment, and lead the node is
            connected to draw a line and arrow from the source to the node
    end foreach
    foreach destination in the node
        determine the destination's winding, segment, and lead that the
            node is connected to draw a line and arrow from the node to the
            destination
    end foreach
end foreach
```

Figure 9:
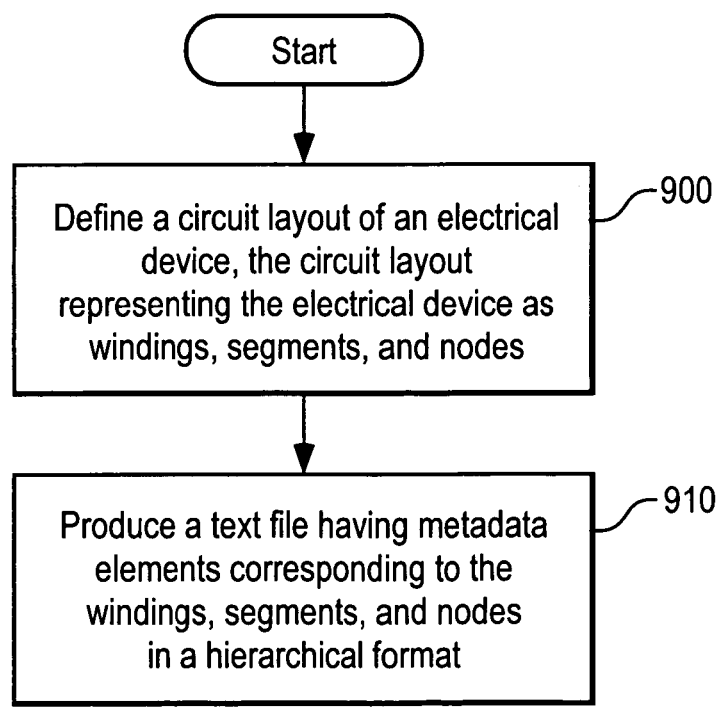
FIG. 9 is an exemplary flow chart illustrating a method for creating a metadata text file corresponding to a circuit layout of an electrical device.

FIG. 9 is a flow chart illustrating a method which corresponds to the foregoing pseudocode for creating a metadata text file corresponding to a circuit layout of an electrical device. A circuit layout of an electrical device is defined (900). The circuit layout representing the electrical device as windings, segments, and nodes. A text file having metadata elements corresponding to the windings, segments, and nodes in a hierarchical format is produced (910).

It should be emphasized that the terms "comprises", "comprising", "includes", and "including", when used in this description and claims, are taken to specify the presence of stated features, steps, or components, but the use of these terms does not preclude the presence or addition of one or more other features, steps, components, or groups thereof.

To facilitate an understanding of exemplary embodiments, many aspects are described in terms of sequences of actions that can be performed by elements of a computer system. For example, it will be recognized that in each of the embodiments, the various actions can be performed by specialized circuits or circuitry (e.g., discrete logic gates interconnected to perform a specialized function), by program instructions being executed by one or more processors, or by a combination of both.

Moreover, the sequences of actions can be embodied in any computer readable medium for use by or in connection with an instruction execution system, apparatus, or device, such as a computer based system, processor containing system, or other system that can fetch the instructions from a computer readable medium and execute the instructions.

As used herein, a "computer readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non exhaustive list) of the computer readable medium can include the following: an electrical connection having one or more wires, a portable computer diskette, a random access memory (RAM), a read only memory (ROM), an erasable programmable read only memory (EPROM or Flash memory), an optical fiber, and a portable compact disc read only memory (CDROM).

Thus, the invention can be embodied in many different forms, and all such forms are contemplated to be within the scope of what is claimed. Any such form of embodiment can be referred to herein as "logic configured to" perform a described action, or alternatively as "logic that" performs a described action.

It will be appreciated by those of ordinary skill in the art that the invention can be embodied in various specific forms without departing from its essential characteristics. The disclosed embodiments are considered in all respects to be illustrative and not restrictive. The scope of the invention is indicated by the appended claims, rather than the foregoing description, and all changes that come within the meaning and range of equivalents thereof are intended to be embraced thereby.

What is claimed is:

1. A method for creating a metadata text file corresponding to a physical configuration of an electrical device, the method comprising:
    defining a physical configuration of an electrical device; and
    producing a text file having metadata elements corresponding to the physical configuration in a hierarchical format; and
    wherein the physical configuration is a geometry of a physical layout of the electrical device, the geometry representing the electrical device as blocks; and
    wherein the electrical device is a transformer and a block represents one of a horizontal layout section, a vertical layout section, a barrier, and a winding.

2. The method of claim 1, wherein defining a geometry of a physical layout comprises:
    in a graphical user interface:
        adding a block identifier representing a block, the block identifier positioned sequentially according to the geometry of the physical layout; and
        adding, when the block contains a sub-block, a sub-block identifier representing the sub-block, the sub-block identifier positioned sequentially according to the geometry of the physical layout within the block.

3. The method of claim 2, comprising:
    displaying a graphical representation of the physical layout of the electrical device corresponding to the block identifier and sub-block identifier.

4. The method of claim 1, wherein a sub-block represents one of a barrier and a winding being included in one of a horizontal layout section and a vertical layout section.

5. The method of claim 1, wherein producing a text file comprises:
    adding a metadata element to the text file for each block and sub-block.

6. The method of claim 5, wherein a child metadata element is positioned in the text file between a start tag and an end tag of the parent metadata element.

7. The method of claim 1, wherein at least one of the metadata elements include an attribute.

8. A data model for defining a geometry of a physical layout of an electrical device as blocks and sub-blocks using a metamarkup language, the data model comprising:
    a metadata element for each block; and
    a child metadata element for each sub-block associated with a respective block, the child metedate element being a child of a metadata element that corresponds to the respective block;
    wherein the metadata elements and child metedata elements are arranged in a hierarchical format; and
    wherein the electrical device is a transformer and a block represents one of a horizontal layout section, a vertical layout section, a barrier, and a winding.

9. The data model of claim 8, wherein each child metadata element is positioned in the data model between a start tag and an end tag of the metadata element.

10. The date model of claim 8, wherein at least one of the metadata elements and child metadata elements include an attribute.

11. The data model of claim 8, wherein a sub-block represents one of a barrier and a winding being included in one of a horizontal layout section and a vertical layout section.

12. A method for creating a metadata text file corresponding to a physical configuration of an electrical device, the method comprising:
    defining a physical configuration of an electrical device; and
    producing a text file having metadata elements corresponding to the physical configuration in a hierarchical format;
    wherein the physical configuration is a circuit layout of an electrical device the circuit layout representing the electrical device as windings, segments, and nodes; and
    wherein the electrical device is a transformer and a winding represents a winding of the transformer, one or more segments represent a winding configuration, and a node represents an end of a winding or a junction of multiple windings.

13. The method of claim 12, wherein defining a circuit layout comprises:

in a graphical user interface:
adding a winding identifier representing a winding;
adding one or more segment identifiers each representing a segment of the winding; and
adding a node Identifier representing a node located at one of an end of a winding or a junction of multiple windings.

14. The method of claim 13, comprising:
displaying a graphical representation of the circuit layout of the electrical device corresponding to the winding identifier, segment identifiers, and node identifier.

15. The method of claim 12, wherein producing a text file comprises: adding a metadata element to the text file for each winding, segment, and node.

16. The method of claim 15, wherein a child metadata element is positioned in the text file between a start tag and an end tag of the parent metadata element.

17. The method of claim 12, wherein at least one of the metadata elements include an attribute.

18. A data model for defining a circuit layout of an electrical device as windings, segments, and nodes using a metamarkup language, the data model comprising:
a metadata element for each winding;
a child metadata element for each segment associated with a respective winding, the child metadata element being a child of a parent metadata element that corresponds to the respective winding; and
a node metadata element for each node located at one of an end of a winding or a junction of multiple windings;
wherein the metadata elements and child metadata elements are arranged in a hierarchical format.

19. The data model of claim 18, wherein each child metadata element is positioned in the data model between a start tag and an end tag of the parent metadata element.

20. The data model of claim 18, wherein at least one of the metadata elements, child metadata elements, and node metadata elements include an attribute.

21. The data model of claim 18, wherein the electrical device is a transformer and a winding represents a winding of the transformer, one or more segments represent a wiring of a winding, and a node represents an end of a winding or a junction of multiple windings.

* * * * *